United States Patent
Lee et al.

(10) Patent No.: US 7,319,064 B2
(45) Date of Patent: Jan. 15, 2008

(54) NITRIDE BASED SEMICONDUCTOR DEVICE AND PROCESS FOR PREPARING THE SAME

(75) Inventors: Jae Hoon Lee, Kyungki-do (KR); Jung Hee Lee, Daegu (KR); Hyun Ick Cho, Daegu (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 269 days.

(21) Appl. No.: 11/203,132

(22) Filed: Aug. 15, 2005

(65) Prior Publication Data

US 2006/0091500 A1 May 4, 2006

(30) Foreign Application Priority Data

Oct. 29, 2004 (KR) .................. 10-2004-0087201

(51) Int. Cl.
*H01L 21/28* (2006.01)
(52) U.S. Cl. .................. 438/604; 257/E21.098
(58) Field of Classification Search ............. 438/604; 257/E21.098
See application file for complete search history.

(56) References Cited

U.S. PATENT DOCUMENTS

2006/0102926 A1* 5/2006 Kikkawa et al. ............ 257/103

* cited by examiner

*Primary Examiner*—Scott B. Geyer
*Assistant Examiner*—Elias Ullah
(74) *Attorney, Agent, or Firm*—McDermott Will & Emery LLP

(57) ABSTRACT

A process for preparing a nitride based semiconductor device in accordance with the present invention comprises growing a high temperature AlN single crystal layer on a substrate; growing a first GaN layer on the high temperature AlN single crystal layer in a first V/III ratio, under a first pressure of 300 Torr or more, such that the predominant direction of growth is the lateral direction; and growing a second GaN layer on the first GaN layer in a second V/III ratio lower than the first V/III ratio, under a second pressure lower than the first pressure such that the predominant direction of growth is the lateral direction.

12 Claims, 9 Drawing Sheets

NITRIDE BASED SEMICONDUCTOR DEVICE AND PROCESS FOR PREPARING THE SAME

RELATED APPLICATION

The present application is based on, and claims priority from, Korean Application Number 2004-87201, filed Oct. 29, 2004, the disclosure of which is incorporated by reference herein in its entirety.

BACKGROUND OF THE INVENTION

1. Field of the Invention

The present invention relates to a nitride based semiconductor device and a process for preparing the same, and more particularly to a nitride based semiconductor device having a GaN layer formed on a silicon substrate and a process for preparing the same.

2. Description of the Related Art

Recently, a great deal of attention has been directed to gallium nitride based semiconductors, as gallium nitride is suitable for application to photoelectric devices with short wavelength bands and high performance electronic devices. Blue and green light emitting diodes made from Group III-nitride based compound semiconductors employing gallium nitride (GaN) were commercialized in the late 1990s. White light emitting diodes are also manufactured from GaN based compound semiconductors, and recently have succeeded in commercialization, thus rapidly increasing in demand thereof. In order to manufacture such nitride based semiconductor light emitting devices, a technique for growing a high quality nitride based single crystal is essential. However, there is a problem that no general substrate for growing nitride based single crystals, which matches with a lattice constant and thermal expansion coefficient of the nitride based single crystals, is available.

Usually, nitride based single crystals are grown on heterologous substrates such as sapphire ($Al_2O_3$) substrate or silicone carbide (SiC) substrate using gas-phase growth methods such as Metal Organic Chemical Vapor Deposition (MOCVD) or Hydride Vapor Phase Epitaxy (HVPE) or Molecular Beam Epitaxy (MBE). However, single crystal sapphire or SiC substrates are expensive and the size thereof is strictly limited to a range of about 2 to 3 inches, thus being unsuitable for mass production.

Meanwhile, where a GaN film is grown on the silicone substrate, it is possible to manufacture a large diameter substrate, resulting in reduction of production costs, to employ conventional silicone device manufacturing methods and apparatuses and to realize monolithic integration of GaN based devices on the silicone (Si) substrate, and thereby it is possible to realize a combination of silicone devices and GaN based devices. Therefore, there remains a need in the art for use of the Si substrate that is most generally used as the substrate in semiconductor industry, other than light emitting devices.

However, due to lattice mismatch resulting from differences in lattice constants between the Si substrate and GaN single crystals, it is difficult to directly grow the single crystal GaN layer on the Si substrate. Further, since there is a difference of about 35% between the thermal expansion coefficients of GaN and Si, when the GaN film is grown directly on the silicone substrate followed by cooling to room temperature, it leads to generation of cracks due to remaining stress in the GaN film. In addition, since the silicone substrate surface exhibits poor wettability of Ga and GaN is not thermodynamically stable as compared to silicone nitride ($Si_3N_4$), direct growth of the GaN film on the silicone substrate may result in an amorphous $Si_3N_4$ film on the surface of the exposed silicone substrate.

Two methods of solving such problems are available. First is to form a low temperature AlN buffer layer on the Si substrate, followed by formation of a GaN epitaxial layer. Second is to form a buffer structure having a multilayer combination of a low temperature AlN buffer layer and AlGaN/GaN on the Si substrate followed by formation of a GaN epitaxial layer thereon. However, even though the GaN layer was formed in such a manner, it fails to fundamentally improve the problems associated with lattice mismatch, and thus it is difficult to easily grow the GaN epitaxial layer on the buffer layer or buffer structure and there suffers from cracking. In particular, when directly forming the GaN layer on the low temperature AlN buffer layer, the GaN layer grows 3-dimensionally rather than two-dimensionally, thus producing island growth leading to poor surface roughness and lowering carrier mobility.

FIG. 1 is a cross-sectional view of a conventional nitride based semiconductor device having a GaN layer formed on a Si substrate. The conventional nitride based semiconductor device using the Si substrate shown in FIG. 1 is prepared by vapor depositing a low temperature AlN buffer layer 12 on a Si substrate 11 at direction (111) using conventional methods at a temperature of 500 to 700° C., forming an AlGaN/GaN intermediate layer 13 having a multilayer structure, and then growing an undoped GaN layer 14 thereon. This low temperature AlN buffer layer 12 and AlGaN/GaN intermediate layer 13 form a buffer structure that reduces the lattice mismatch between the lower Si substrate 11 and upper GaN layer 14.

However, since the lattice mismatch between Si and GaN is very high, i.e., about 20%, cracks occurring due to lattice mismatch, in spite of forming such a buffer structure, are still present, and complexity increases which requires formation of an AlGaN/GaN intermediate layer 13 having a multilayer structure. Therefore, there is required a method capable of forming a good quality GaN layer on the Si substrate in a more simplified process.

SUMMARY OF THE INVENTION

Therefore, the present invention has been made in view of the above problems, and it is an object of the present invention to provide a process for preparing a nitride based semiconductor device, which is capable of easily forming a GaN layer on a Si substrate in a more simplified process and of sufficiently inhibiting crack generation.

It is another object of the present invention to provide a nitride based semiconductor device having a good quality GaN layer that is substantially crack-free and has an even surface.

In accordance with the present invention, the above and other objects can be accomplished by the provision of a process for preparing a nitride based semiconductor device comprising growing a high temperature AlN single crystal layer on a substrate; growing a first GaN layer on the high temperature AlN single crystal layer in a first V/III ratio, under a first pressure of 300 Torr or more, such that the predominant direction of growth is the lateral direction; and growing a second GaN layer on the first GaN layer in a second V/III ratio lower than the first V/III ratio, under a second pressure-lower than the first pressure. In this connection, the substrate may be a silicone substrate.

Preferably, the high temperature AlN single crystal layer is grown to a thickness of 200 to 1000 Å. In addition, the AlN single crystal layer is preferably grown at a temperature of 1050 to 1200° C. The steps of growing the first GaN layer and second GaN layer are preferably performed at almost the same temperature as that of growing the AlN single crystal layer.

In the step of growing the first GaN layer, the first pressure is preferably within the range of 300 to 760 Torr. In addition, the step of growing the first GaN layer may include forming a GaN nucleation seed layer for two-dimensional growth in a V/III ratio of at least 10000 on the AlN single crystal layer, and forming the first GaN layer in a V/III ratio of at least 6000 using the GaN nucleation seed layer. In this case, preferably, the V/III ratio for forming the GaN nucleation seed layer is within the range of 10000 to 150000, and the V/III ratio for forming the first GaN layer is within the range of 6000 to 12000. Further, the V/III ratio for forming the nucleation seed may be higher than that for forming the first GaN layer.

Preferably, in the step of growing the second GaN layer, the second pressure is 100 Torr or less, and the second V/III ratio is 3000 or less. More preferably, the second pressure is between 10 and 50 Torr, and the second V/III ratio is between 800 and 3000.

In accordance with the process for preparing a nitride based semiconductor device, the crystal defect density of the first GaN layer can be lowered to $10^9$ cm$^{-3}$ or less, and the crystal defect density of the second GaN layer can be lowered to $10^8$ cm$^{-3}$ or less. Therefore, high quality nitride based semiconductor optical devices such as a nitride based light emitting diode can be prepared using the above-mentioned process for preparing a nitride based semiconductor device.

In order to accomplish another object of the present invention, a nitride based semiconductor device in accordance with the present invention comprises a high temperature AlN single crystal layer formed on a substrate; a GaN nucleation seed layer formed on the high temperature AlN single crystal layer; a first GaN layer which is predominantly grown in the lateral direction on the GaN nucleation seed layer and has a crystal defect density of $10^9$ cm$^{-3}$ or less; and a second GaN layer which is predominantly grown in the lateral direction on the first GaN layer and has a crystal defect density of $10^8$ cm$^{-3}$ or less. In this case, the substrate may be a silicone substrate. Preferably, the high temperature AlN single crystal layer has a thickness of 200 to 1000 Å.

The present invention provides a method of growing a thin GaN single crystal film having substantially no cracks and having an even surface by controlling a V/III ratio and pressure over the AlN single crystal layer grown on the Si substrate at a high temperature of 1050° C. or more. For this purpose, the GaN seed layer is formed on the high temperature AlN single crystal layer grown on the Si substrate, at a high V/III ratio and high pressure, and then the GaN layer is formed thereon at a high V/III ratio and high pressure. Thereafter, in order to further facilitate two-dimensional growth, the GaN layer is formed at a low V/III ratio and low pressure so as to easily obtain a good quality GaN single crystal thin film.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
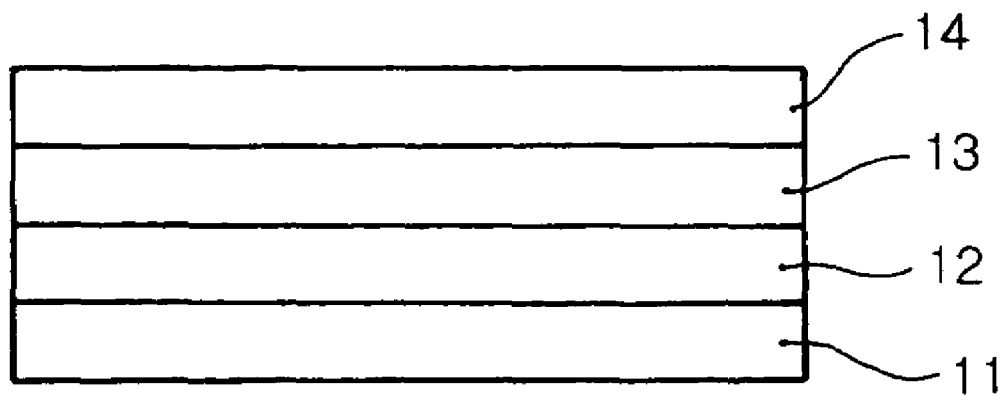
FIG. 1 is a cross-sectional view of a conventional nitride based semiconductor device.

The present invention now will be described more fully with reference to the accompanying drawings, in which embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. Therefore, in the drawings, shape and size of some elements may be exaggerated for clarity, and like numbers refer to like elements throughout.

Figure 2:
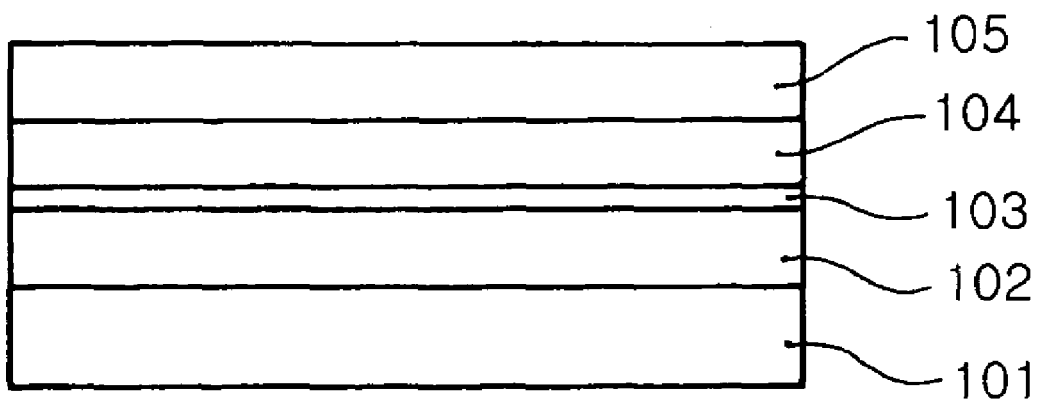
FIG. 2 is a cross-sectional view of a nitride based semiconductor device in accordance with the present invention.

FIG. 2 schematically shows a cross-sectional structure of a nitride based semiconductor device in accordance with one embodiment of the present invention. Referring to FIG. 2, a high temperature AlN single crystal layer 102 grown at a high temperature of 1050° C. or more was formed on the surface of a Si substrate 101 in the direction (111). This was followed by sequentially laminating a GaN nucleation seed layer 103 for two-dimensional growth, a first GaN layer 104 which was two-dimensionally grown at a high V/III ratio of 6000 or more and high pressure of 300 Torr or more and a second GaN layer 105 which was two-dimensionally grown at a low V/III ratio of 3000 or less and low pressure of 100 Torr or less. The high temperature AlN single crystal layer 102 is a layer grown at a high temperature of 1050° C. or more and preferably has a thickness of about 200 to 1000 Å.

The first GaN layer is a layer that was predominantly grown in the lateral direction and has a crystal defect density of $10^9$ cm$^{-3}$ or less. Further, the second GaN layer is a layer that was laterally grown and formed and has a crystal defect density of $10^8$ cm$^{-3}$ or less, and the upper surface thereof is very even and has only a few cracks. This is because GaN continues to progress two-dimensional growth in the lateral direction from the GaN nucleation seed layer 103, so as to form the first GaN layer 104, thus significantly alleviating lattice mismatch between Si and GaN, and lateral growth remarkably improves surface roughness of the GaN layer. That is, the first GaN layer 104 serves as a sponge to alleviate the lattice mismatch between Si and GaN. Therefore, the second upper GaN layer 105 forms a substantially crack-free and high quality GaN single crystal layer. It was experimentally confirmed that in order to form those GaN nucleation seed layer 103 and the first and second GaN layers 104 and 105, a V/III ratio and pressure act as important factors.

The term "V/III ratio" as used herein refers to a ratio of flow rate between trimethylgallium (TMG) gas, a Ga (Group III) source gas used when forming the GaN layer, and $NH_3$ gas, a N (Group V) source gas, and represents a ratio of $NH_3$ gas flow rate to a TMG gas flow rate which is supplied to a reaction chamber for forming the GaN layer (flow rate of respective source gas is expressed in terms of µmol/min). Therefore, the high V/III ratio means that a proportion of the TMG gas flow rate is lower as compared to the $NH_3$ gas flow rate.

Now, referring to FIGS. 3a through 3d and FIG. 4, a process for preparing a nitride based semiconductor device in accordance with one embodiment of the present invention will be described.

Figure 3A:
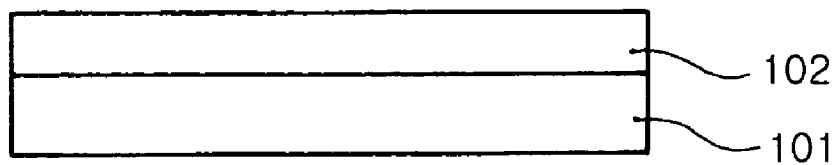
FIGS. 3a through 3d are cross-sectional views illustrating a process for preparing a nitride based semiconductor device in accordance with the present invention.
Figure 3B:
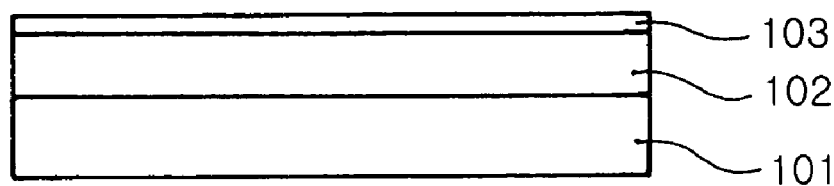
Figure 3C:
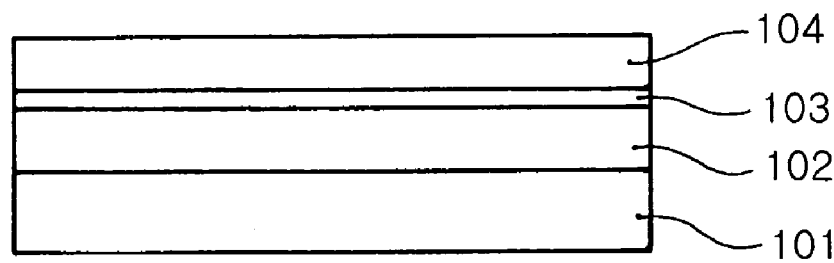
Figure 3D:
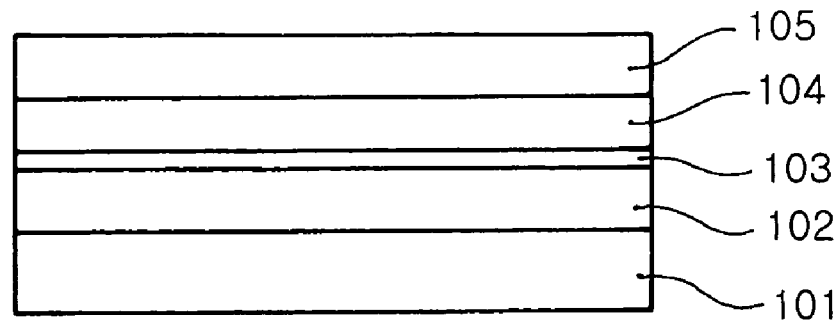
Figure 4:
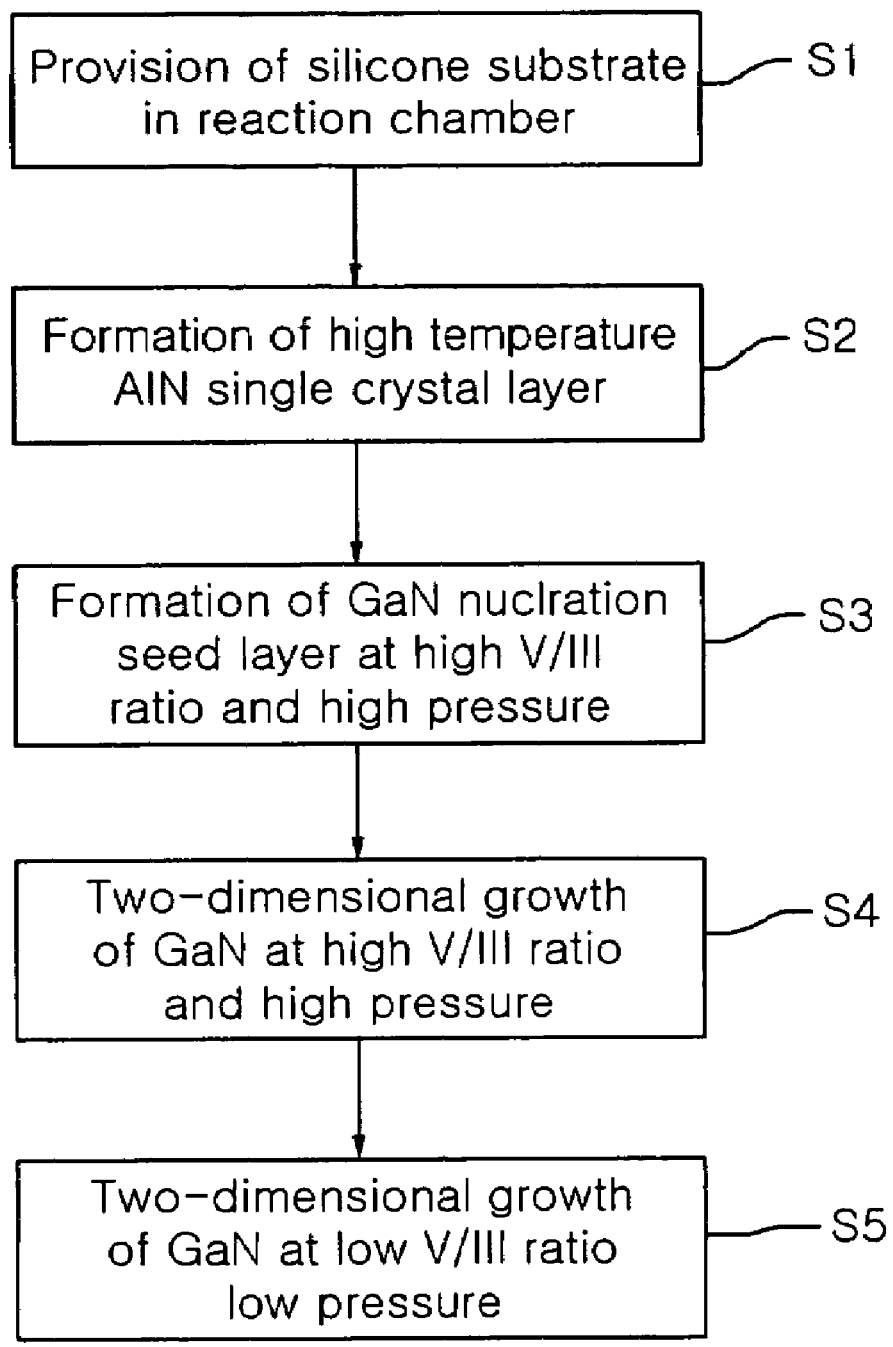
FIG. 4 is a process flow chart showing a process for preparing a nitride based semiconductor device in accordance with the present invention.

FIGS. 3a through 3d are cross-sectional views illustrating a process for preparing a nitride based semiconductor device in accordance with the present invention, and FIG. 4 is a process flow chart showing a process for preparing a nitride based semiconductor device in accordance with the present invention.

As shown in FIG. 3a, a Si substrate 101 having upper surface of the direction (111) was first placed in a reaction chamber (S1 in FIG. 4), and a high temperature AlN single crystal layer 102 was formed on the silicone substrate at a temperature of about 1050° C. or more (S2 in FIG. 4). At this time, the growth temperature of the high temperature AlN single crystal layer 102 was a very important factor, and used a temperature of 1050° C. or more, unlike conventional low temperature AlN buffer layer formation. Preferably, the high temperature AlN single crystal layer 102 was grown at a temperature of 1050 to 1200° C., and more preferably at a temperature of 1100 to 1200° C. The grown high temperature AlN single crystal layer 102 exhibited high crystallinity, as shown in FIG. 5.

Figure 5:
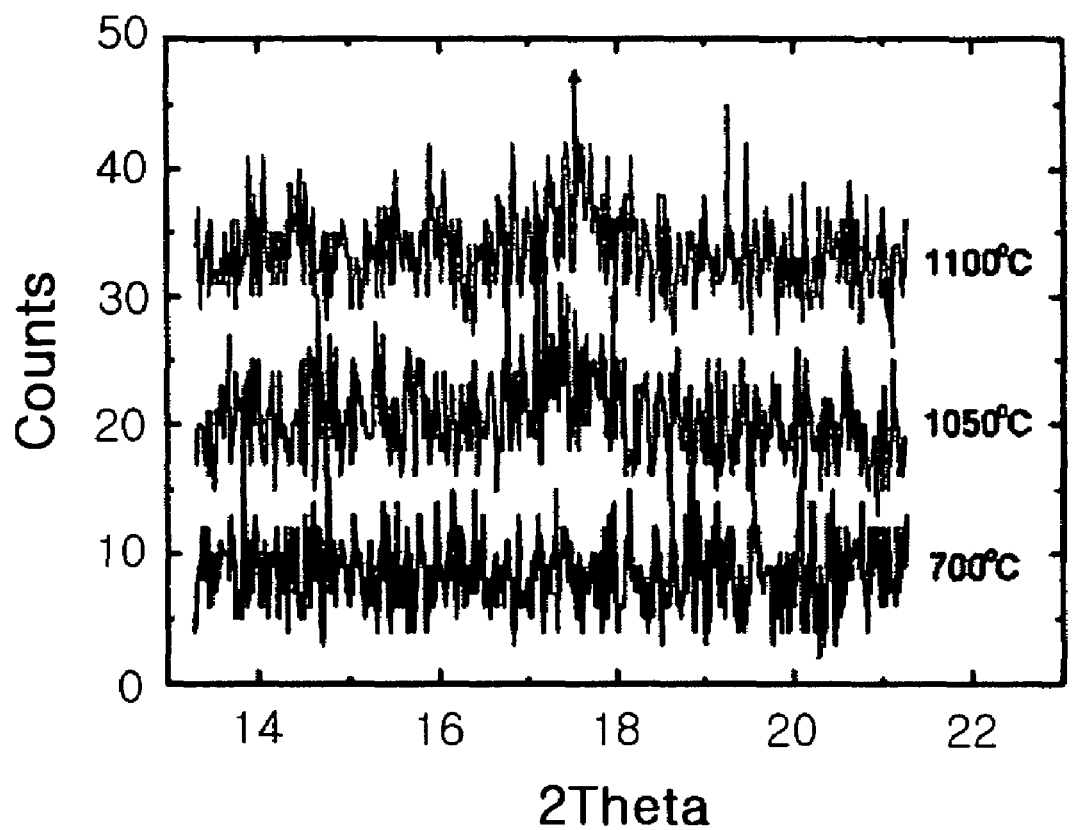
FIG. 5 is a graph showing X-ray diffraction experimental results of AlN layers having different growth temperatures.

FIG. 5 is a graph showing X-ray diffraction (XRD) experimental results of AlN layers formed at different growth temperature. The graph in FIG. 5 shows X-ray diffraction (XRD) experimental results of AlN layers grown at 700° C., 1050° C. and 1100° C., respectively. Referring to FIG. 5, the AlN layer grown at 700° C. showed various peaks in amorphous and polycrystalline forms. In contrast, the AlN layers grown at 1050° C. and 1100° C. showed higher crystallinity, and the higher temperature leaded to single crystallization of the AlN layer. The present invention employed the high temperature AlN single crystal layer grown at a temperature of 1050° C. or more.

Next, as shown in FIG. 3b, a GaN nucleation seed layer 103 was formed on the high temperature AlN single crystal layer 102 (S3 in FIG. 4). That is, TMG gas and $NH_3$ gas were supplied to the reaction chamber in a high V/III ratio of 10000 or more and at a high pressure of 300 Torr or more, so as to form a GaN nucleation seed layer 103 for two-dimensional growth. Preferably, the temperature of forming the GaN nucleation seed layer 103 was maintained in the range of 1050 to 1100° C. A nucleation seed for two-dimensional growth was formed and unevenly distributed on the GaN nucleation seed layer 103. This GaN nucleation seed layer 103 serves as a source such that a subsequent GaN layer growth exhibits two-dimensional growth. In order to form this GaN nucleation seed layer 103, the V/III ratio and pressure serve as important factors.

Thereafter, as shown in FIG. 3c, GaN was grown at a high V/III ratio of 6000 or more and high pressure of 300 Torr or more so as to form a first GaN layer 104 (S4 in FIG. 4). When GaN was grown from the GaN nucleation seed layer 103 at the above-mentioned high V/III ratio and high pressure, lateral growth exhibited predominant two-dimensional growth. In this connection, the growth temperature for formation of the first GaN layer 104 is preferably between 1050 and 1100° C., and more preferably between 1000 and 1100° C.

As such, when a growth of the first GaN layer 104 achieved predominant two-dimensional growth in the lateral direction, there were very few cracks or defects produced due to lattice mismatch between Si and GaN. In particular, the crystal defect density of the first GaN layer 104 dropped below about $10^9$ $cm^{-3}$. It is understood that this is because the first GaN layer 104, which was two-dimensionally grown from the GaN nucleation seed layer 103 on the high temperature AlN single crystal layer 102, served to absorb stress resulting from lattice mismatch or differences in thermal expansion coefficient. Due to high pressure and high V/III ratio applied when growing the first GaN layer 104, the growth rate of the first GaN layer was very low.

Next, two-dimensional growth of the GaN layer was further promoted by forming the GaN layer at a low pressure of 100 Torr or less and low V/III ratio of 3000 or less. Therefore, a second GaN layer 105 was formed, as shown in FIG. 3d (S5 in FIG. 4). Since sufficient two-dimensional growth was already achieved in the previous step (S4), even when the GaN layer was grown at the lowered V/III of 3000 or less, two-dimensional growth continued. In particular, since, when the second GaN layer 105 was grown, a sufficient amount of TMG gas was supplied by lowering the V/III ratio and low pressure of 100 Torr or less was used, the growth rate of the second GaN layer 105 became higher, and two-dimensional growth was very facilitated.

Thus, the completed second GaN layer 105 exhibited substantially no cracks due to lattice mismatch or differences in thermal expansion coefficient between Si and GaN. In particular, the crystal defect density of the second GaN layer 105 dropped to $10^8$ $cm^{-3}$ or less. In addition, the second GaN layer 105 has an even surface exhibiting excellent surface roughness. Therefore, using the second GaN layer 105 thus formed, it is possible to prepare high quality nitride based semiconductor optical devices such as GaN based light emitting diodes. In addition, it is possible to achieve improved productivity and monolithic integration with other silicone based devices due to use of the silicone substrate.

EXAMPLES

In order to further confirm improved characteristics of the nitride based semiconductor device in accordance with the present invention, a nitride based semiconductor sample was formed in accordance with one embodiment of the present invention, and a nitride based semiconductor sample was formed in accordance with the following Comparative Example 1. During formation of such samples, the respective layers of samples were analyzed by SEM.

Example 1

First, a Si substrate (111) was placed in a reaction chamber and a high temperature AlN single crystal layer was formed on the substrate at a high temperature of about 1100° C. Then, TMG gas and NH₃ gas were supplied to the reaction chamber at a flow rate of about 30 μmol/min and about 401780 μmol/min, respectively, under a temperature of about 1050° C. and pressure of about 300 Torr, so as to form a GaN nucleation seed layer in a high V/III ratio of about 13390.

Figure 6:
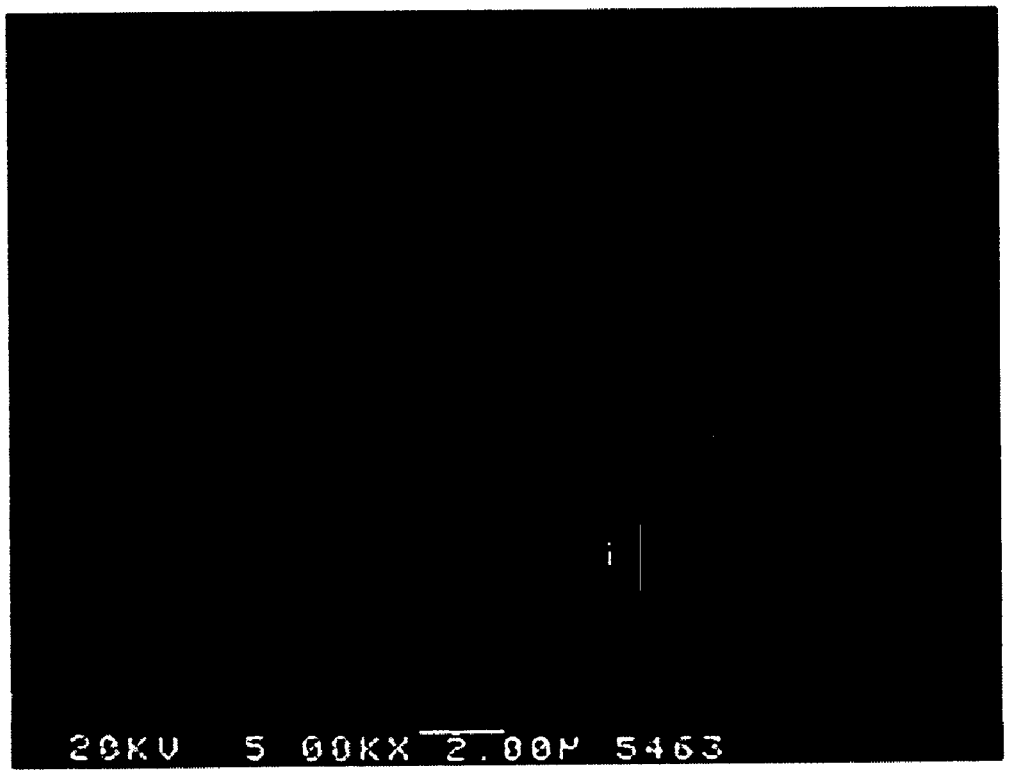
FIG. 6 is an SEM showing a surface of a GaN nucleation seed layer formed according to one embodiment of the present invention.

FIG. 6 is an SEM showing the surface of the formed GaN nucleation seed layer. As shown in FIG. 6, it was confirmed that nucleation seed was heterogeneously distributed in the form of coarse particles on the surface of the GaN seed layer. This nucleation seed became an important factor allowing subsequent growth to achieve two-dimensional growth.

Figure 7A:
FIGS. 7a and 7b are, respectively, SEMs showing a surface and cross-section of a first GaN layer formed according to one embodiment of the present invention.
Figure 7B:

Subsequently, a GaN layer was grown at a temperature of about 1050° C. for about 30 min using the same NH₃ and TMG gas flow rate as those used in forming the GaN seed layer, while maintaining a V/III ratio of about 13390. Lateral growth-predominant two-dimensional growth was achieved from the GaN nucleation seed layer to form a first GaN layer. FIGS. 7a and 7b are, respectively, SEMs showing a surface and cross-section of the formed first GaN layer. As shown in FIGS. 7a and 7b, the first GaN layer had a widely spread form in the planar direction (lateral direction), and also exhibited a very even state of a sectional morphology. However, there was still step on the surface of the first GaN layer, and two-dimensional growth was not sufficiently achieved to such a degree that step did not appear on the surface of the first GaN layer.

Figure 8:
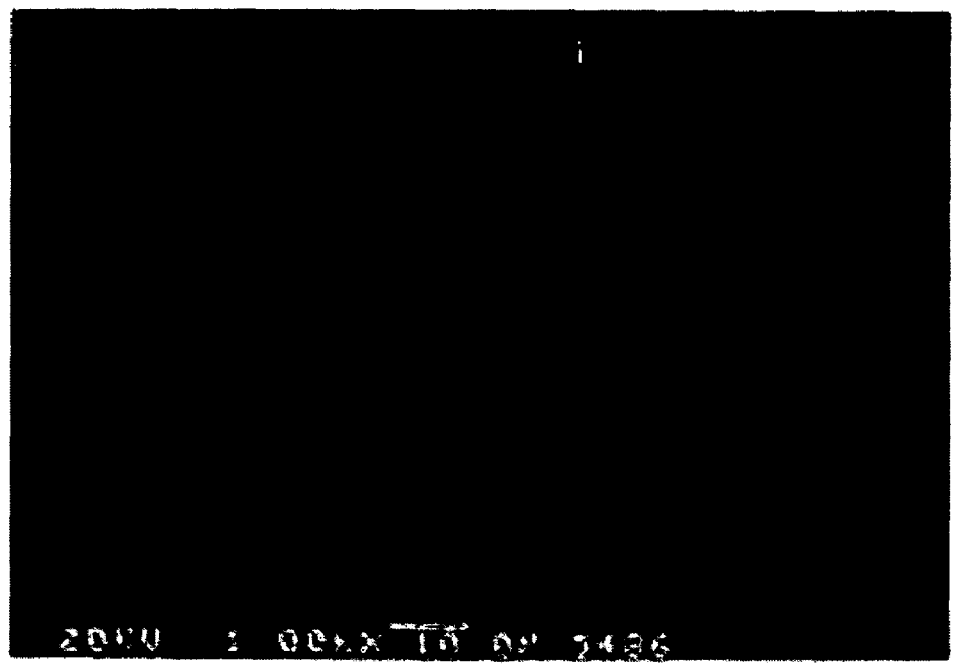
FIG. 8 is an SEM showing a surface of a second GaN layer formed according to one embodiment of the present invention.

Next, by increasing the flow rate of TMG gas to about 170 μmol/min while maintaining a flow rate of NH₃ gas, which was supplied to the reaction chamber, at about 401780 μmol/min, the V/III ratio was decreased to about 2360 and the pressure was decreased from 300 Torr to 50 Torr to form a GaN layer. At this time, the growth temperature was continuously maintained at about 1050° C. Thereby, two-dimensional growth of the GaN was promoted and then a second GaN layer having a substantially crack-free, even surface was obtained. FIG. 8 is an SEM showing a surface of the second GaN layer. As shown in FIG. 8, there was no substantially step on the surface of the second GaN layer and the surface thereof was very even. In addition, the second GaN layer was substantially crack-free.

Comparative Example 1

In order to examine the effects of the V/III ratio on growth behavior of a GaN layer upon forming the GaN layer on a high temperature AlN single crystal layer, a semiconductor sample including the high temperature AlN single crystal layer and GaN layer on a Si substrate was prepared as follows.

Figure 9:
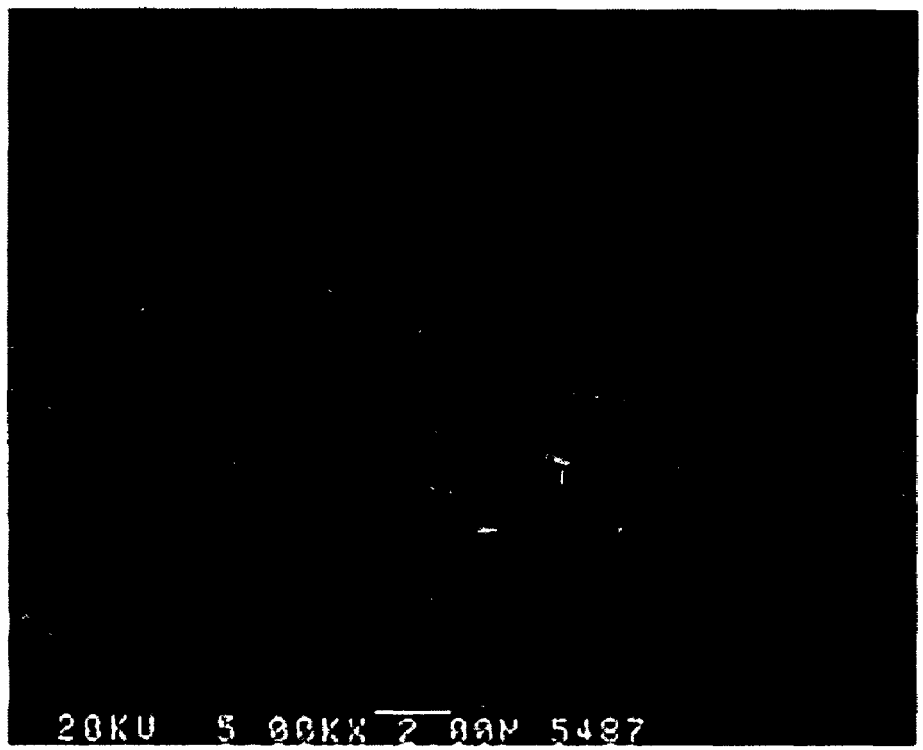
FIG. 9 is an SEM showing a surface of a GaN layer formed according to Comparative Example 1, for comparing with a layer shown in FIG. 6.

First, a high temperature AlN single crystal layer was formed on a Si substrate (111), in the same manner as Example 1. Then, (unlike Example 1) TMG gas and NH₃ gas were supplied to the reaction chamber at a flow rate of about 170 μmol/min and about 401780 μmol/min, respectively, so as to form a GaN layer on the high temperature AlN single crystal layer in a low V/III ratio of about 2360 at a temperature of 1050° C. and pressure of about 300 Torr. FIG. 9 is an SEM showing a surface and cross-section of the formed GaN layer. As can be seen from FIG. 9, in the case of Comparative Example 1, there was not found the GaN nucleation seed layer, which was shown in the SEM of FIG. 6, on the high temperature AlN single crystal layer.

Figure 10A:
FIGS. 10a and 10b are, respectively, SEMs showing a surface and cross-section of a GaN layer formed according to Comparative Example 1, for comparing with layers shown in FIGS. 7a and 7b.
Figure 10B:
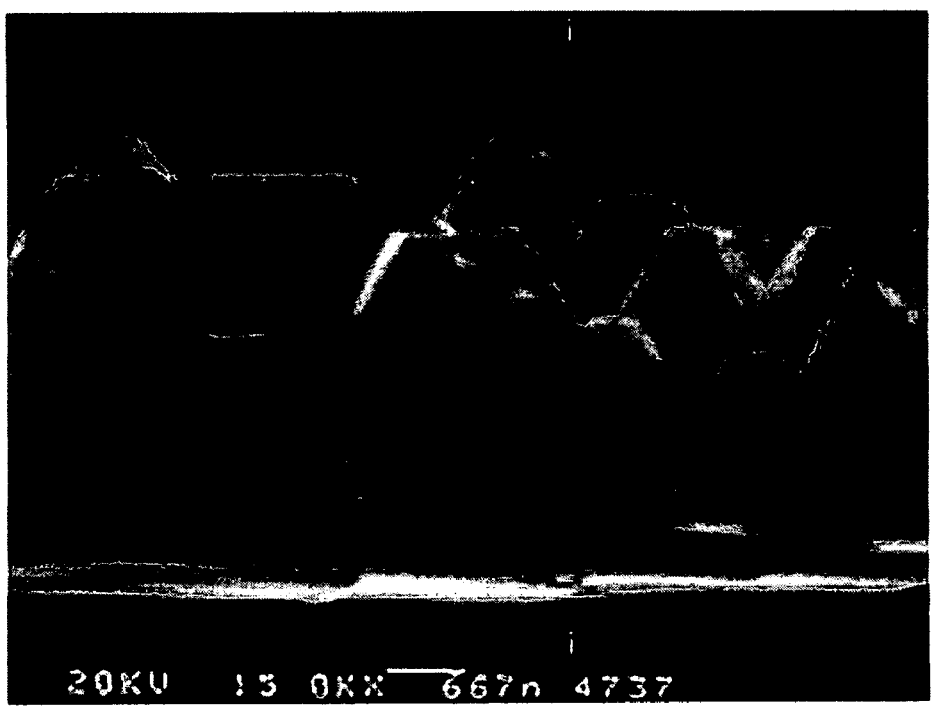
Figure 11:
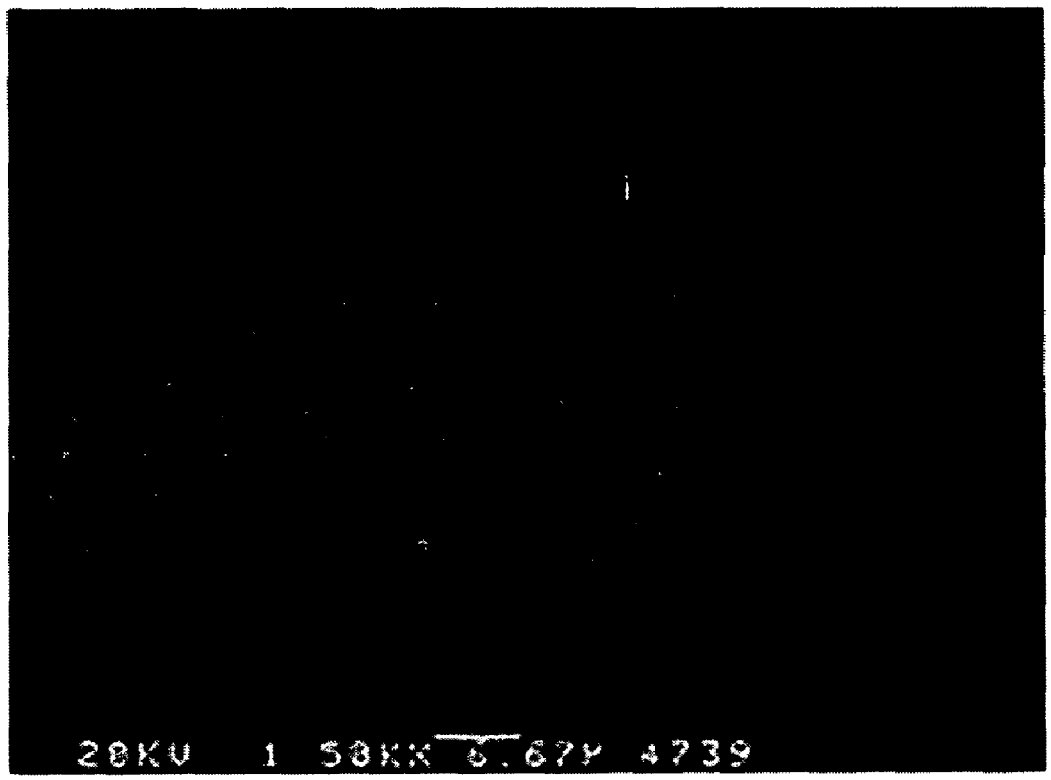
FIG. 11 is an SEM showing a surface of a GaN layer formed according to Comparative Example 1, for comparing with the GaN layer shown in FIG. 8.

Subsequently, a GaN layer was grown for about 30 min while maintaining a pressure of 300 Torr, temperature of 1050° C. and V/III ratio of about 2360. FIGS. 10a and 10b are, respectively, SEMs showing a surface and cross-section of the grown GaN layer. As can be seen from FIGS. 10a and 10b, the grown GaN layer exhibited a mountain-shaped surface morphology. This is because the GaN layer was three-dimensionally grown. That is, in the case of Comparative Example 1, the GaN layer was grown three-dimensionally, not two-dimensionally, unlike Example 1.

Next, the GaN layer was continuously grown by lowering pressure from 300 Torr to 50 Torr while maintaining the same process conditions for a V/III ratio and temperature. As such, even when the pressure was changed to low pressure, two-dimensional growth of the GaN layer was not achieved but the GaN layer was continuously grown to only three-dimensions. FIG. 8 is an SEM showing a surface of the GaN layer obtained by lowering the pressure as described above. As shown in FIG. 8, the surface of the GaN layer appears to be very rough due to three-dimensional growth. Such a three-dimensionally grown GaN layer is very susceptible to stress resulting from lattice mismatch between Si and GaN, thus resulting in easy generation of cracks.

As described above, in accordance with the present invention, it is possible to obtain a good quality GaN layer having excellent surface roughness on a Si substrate and it is also possible to effectively inhibit crack generation. It is possible to easily grow a good quality GaN layer on a Si substrate and thereby use of the large diameter Si substrate leads to production of nitride based electronic devices such as nitride based light emitting devices at reduced production costs and high productivity. Further, there is no need to form an AlGaN/GaN intermediate layer having a multilayer structure thus resulting in simplified production process.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A process for preparing a nitride based semiconductor device, comprising:
    growing a high temperature AlN single crystal layer on a substrate;
    growing a first GaN layer on the high temperature AlN single crystal layer in a first V/III ratio, under a first pressure of 300 Torr or more, such that the predominant direction of growth is the lateral direction; and
    growing a second GaN layer on the first GaN layer in a second V/III ratio lower than the first V/III ratio, under a second pressure lower than the first pressure.

2. The process as set forth in claim 1, wherein the high temperature AlN single crystal layer has a thickness of 200 to 1000 Å.

3. The process as set forth in claim 1, wherein the step of growing the high temperature AlN single crystal layer is performed at a temperature of 1050 to 1200° C.

4. The process as set forth in claim 3, wherein the steps of growing the first GaN layer and second GaN layer are performed at almost the same temperature as that of growing the AlN single crystal layer.

5. The process as set forth in claim 1, wherein the first pressure is within the range of 300 to 760 Torr, and the step of growing the first GaN layer includes forming a GaN nucleation seed layer for two-dimensional growth in a V/III ratio of at least 10000 on the AlN single crystal layer, and forming the first GaN layer in a V/III ratio of at least 6000 using the GaN nucleation seed layer.

6. The process as set forth in claim 5, wherein the V/III ratio for forming the GaN nucleation seed layer is within the range of 10000 to 150000, and the V/III ratio for forming the first GaN layer is within the range of 6000 to 12000.

7. The process as set forth in claim 6, wherein the V/III ratio for forming the nucleation seed is higher than the V/III ratio for forming the first GaN layer.

8. The process as set forth in claim 1, wherein the second pressure is 100 Torr or less, and the second V/III ratio is 3000 or less.

9. The process as set forth in claim 8, wherein the second pressure is between 10 and 50 Torr, and the second V/III ratio is between 800 and 3000.

10. The process as set forth in claim 1, wherein the crystal defect density of the first GaN layer is $10^9$ cm$^{-3}$ or less.

11. The process as set forth in claim 1, wherein the crystal defect density of the second GaN layer is $10^8$ cm$^{-3}$ or less.

12. The process as set forth in claim 1, wherein the substrate is a silicone substrate.

* * * * *